(12) United States Patent
Bang

(10) Patent No.: US 7,492,099 B2
(45) Date of Patent: Feb. 17, 2009

(54) PLASMA DISPLAY DEVICE

(75) Inventor: Heung-Chul Bang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 143 days.

(21) Appl. No.: 11/134,257

(22) Filed: May 23, 2005

(65) Prior Publication Data
US 2005/0258726 A1 Nov. 24, 2005

(30) Foreign Application Priority Data
May 24, 2004 (KR) ...................... 10-2004-0036856

(51) Int. Cl.
*H01J 17/49* (2006.01)
*H05K 7/00* (2006.01)
(52) U.S. Cl. ....................... 313/582; 313/238; 313/292; 361/681; 361/825
(58) Field of Classification Search ....................... None
See application file for complete search history.

(56) References Cited

U.S. PATENT DOCUMENTS

| | | | |
|---|---|---|---|
| 6,198,222 B1 | 3/2001 | Chang | |
| 6,494,429 B2 * | 12/2002 | Tajima | 248/473 |
| 6,560,124 B1 * | 5/2003 | Irie et al. | 361/816 |
| 7,106,392 B2 * | 9/2006 | You | 349/58 |
| 2001/0048600 A1 * | 12/2001 | Oishi et al. | 362/294 |
| 2002/0159240 A1 * | 10/2002 | Watanabe et al. | 361/752 |
| 2004/0036396 A1 * | 2/2004 | Kang et al. | 313/231.31 |
| 2005/0093429 A1 * | 5/2005 | Ahn et al. | 313/498 |

FOREIGN PATENT DOCUMENTS

| | | | |
|---|---|---|---|
| CN | 1459768 | | 12/2003 |
| CN | 1459768 A | * | 12/2003 |
| CN | 1463417 | | 12/2003 |
| JP | 11-272182 | | 10/1999 |
| JP | 2002-006757 | | 1/2002 |
| JP | 2004117875 A | * | 4/2004 |
| KR | 10-2003-0033718 A | | 5/2003 |

* cited by examiner

Primary Examiner—Ashok Patel
(74) Attorney, Agent, or Firm—H.C. Park & Associates, PLC

(57) ABSTRACT

A plasma display device including a chassis base, a plasma display panel coupled with a panel mounting surface of the chassis base, and reinforcing members that are integrally formed with the chassis base so as to project from a surface of the chassis base. The reinforcing members may be composed of bracket members, and the reinforcing members may project toward an opposite side of the panel mounting surface of the chassis base.

9 Claims, 8 Drawing Sheets

PLASMA DISPLAY DEVICE

CROSS REFERENCE TO RELATED APPLICATION

This application claims priority to and the benefit of Korean Patent Application No. 10-2004-0036856, filed on May 24, 2004, which is hereby incorporated by reference for all purposes as if fully set forth herein.

BACKGROUND OF THE INVENTION

1. Field of the Invention

The present invention relates to a plasma display device having a chassis base that may cost less to manufacture and is more reliable.

2. Discussion of the Background

Generally, a plasma display device displays images by discharging gas in a plasma display panel (PDP) to generate plasma.

The plasma display device typically includes the PDP, a chassis base for mounting the PDP, PDP circuit boards mounted on a circuit mounting surface of the chassis base, a front cabinet in front of the PDP, and a back cover behind and enclosing the chassis base.

With this structure, the chassis base may be made of aluminum, which has high thermal conductivity, to dissipate heat generated from the PDP to the outside of the display device.

Therefore, as shown in FIG. 6 and FIG. 7, brackets 104 may be separately mounted on the chassis base 102 in order to reinforce the chassis base.

In FIG. 6, reference numeral 102' denotes a circuit mounting surface of the chassis base 102. Additionally, in FIG. 7, reference numeral 106 denotes a joining point where the bracket 104 may be joined to the chassis base 102. In this case, generally, the brackets may be joined to the chassis base 102 by a sheet metal joining method, such as a TOX® method.

However, separately providing brackets to reinforce the chassis base may increase the number of manufacturing processes, thereby resulting in lower productivity and increased manufacturing costs. Further, the joining strength between the brackets and the chassis base may not be uniform, which may result in less reliable joining strength.

SUMMARY OF THE INVENTION

The present invention provides a plasma display device having a chassis base capable of achieving a reduction in manufacturing costs, an improvement in productivity, and a reduction in the percent defective.

Additional features of the invention will be set forth in the description which follows, and in part will be apparent from the description, or may be learned by practice of the invention.

The present invention discloses a plasma display device including a chassis base, a plasma display panel coupled with a panel mounting surface of the chassis base, and reinforcing members that are integrally formed with the chassis base and projecting from a surface of the chassis base.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Hereinafter, an exemplary embodiment of the invention will be described in detail with reference to the accompanying drawings.

Figure 1:
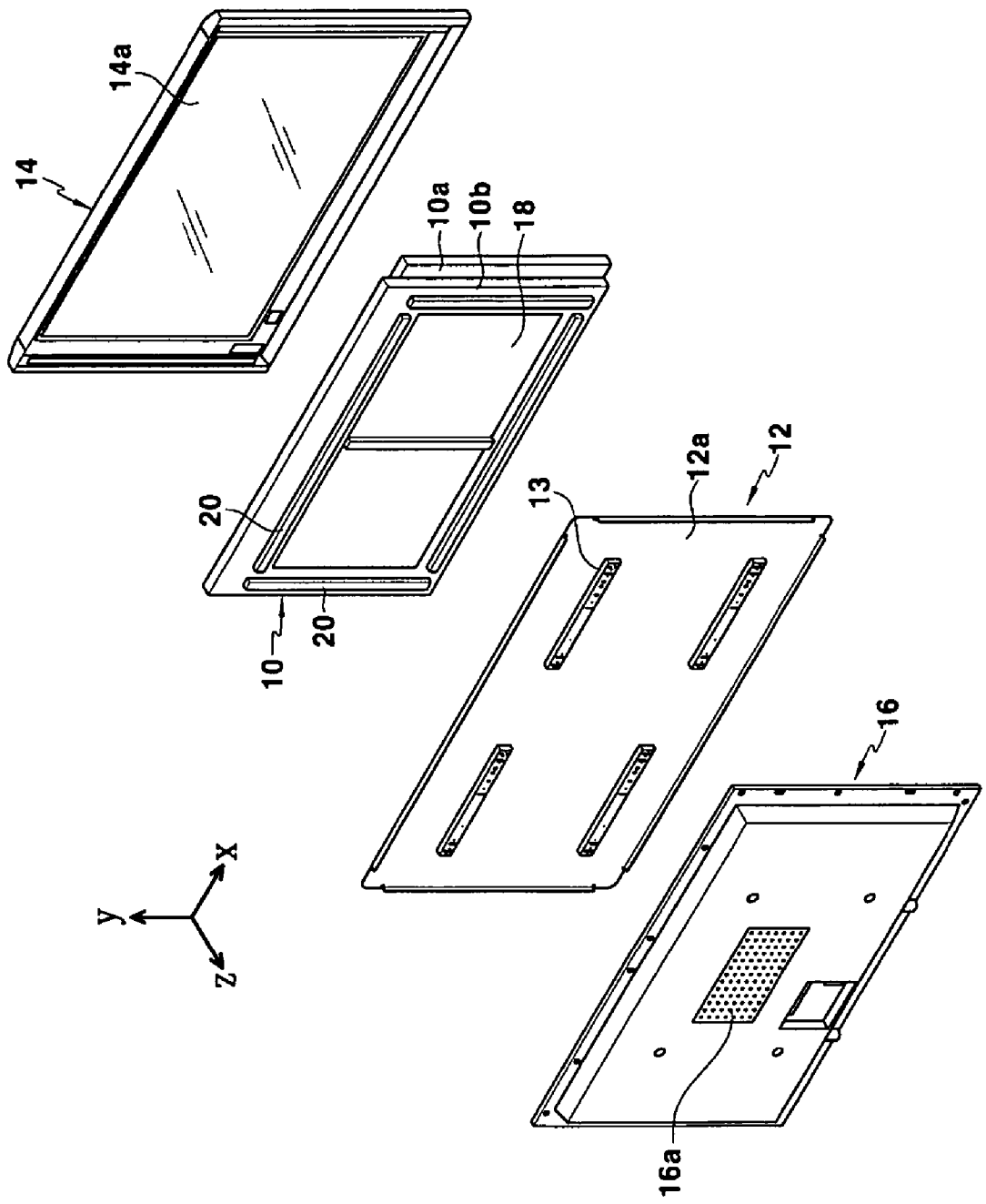
FIG. 1 is an exploded perspective view showing a plasma display device according to an exemplary embodiment of the invention.

FIG. 1 is an exploded perspective view showing a plasma display device according to an exemplary embodiment of the invention.

As FIG. 1 shows, the plasma display device may include a PDP 10, a chassis base 12 coupled with the PDP 10, PDP circuit boards (not shown) mounted to a circuit mounting surface 12a of the chassis base 12, a front cabinet 14 in front of the PDP 10, and a back cover 16 behind and enclosing the chassis base 12.

The PDP 10 comprises a front substrate 10a and a rear substrate 10b that are joined together by a sealing material, such as frit, and plasma generating discharge cells are formed with the PDP 10. With this structure, the PDP 10 emits visible rays to display a color image.

Further, various circuit board assemblies (not shown), such as, for example, a power supply board, an image processing board, an address buffer board, a sustain electrode driving board, and a scanning electrode driving board may be coupled to the circuit mounting surface 12a, which is the rear surface of the chassis base 12 that faces the back cover 16. The chassis base 12 may be made of a material, such as, for example, aluminum that has high thermal conductivity to dissipate heat generated from the chassis base 12 and the circuit board assemblies. Further, in this embodiment, the chassis base 12 has reinforcing bracket members 13 for reinforcing the chassis base 12.

Figure 2A:
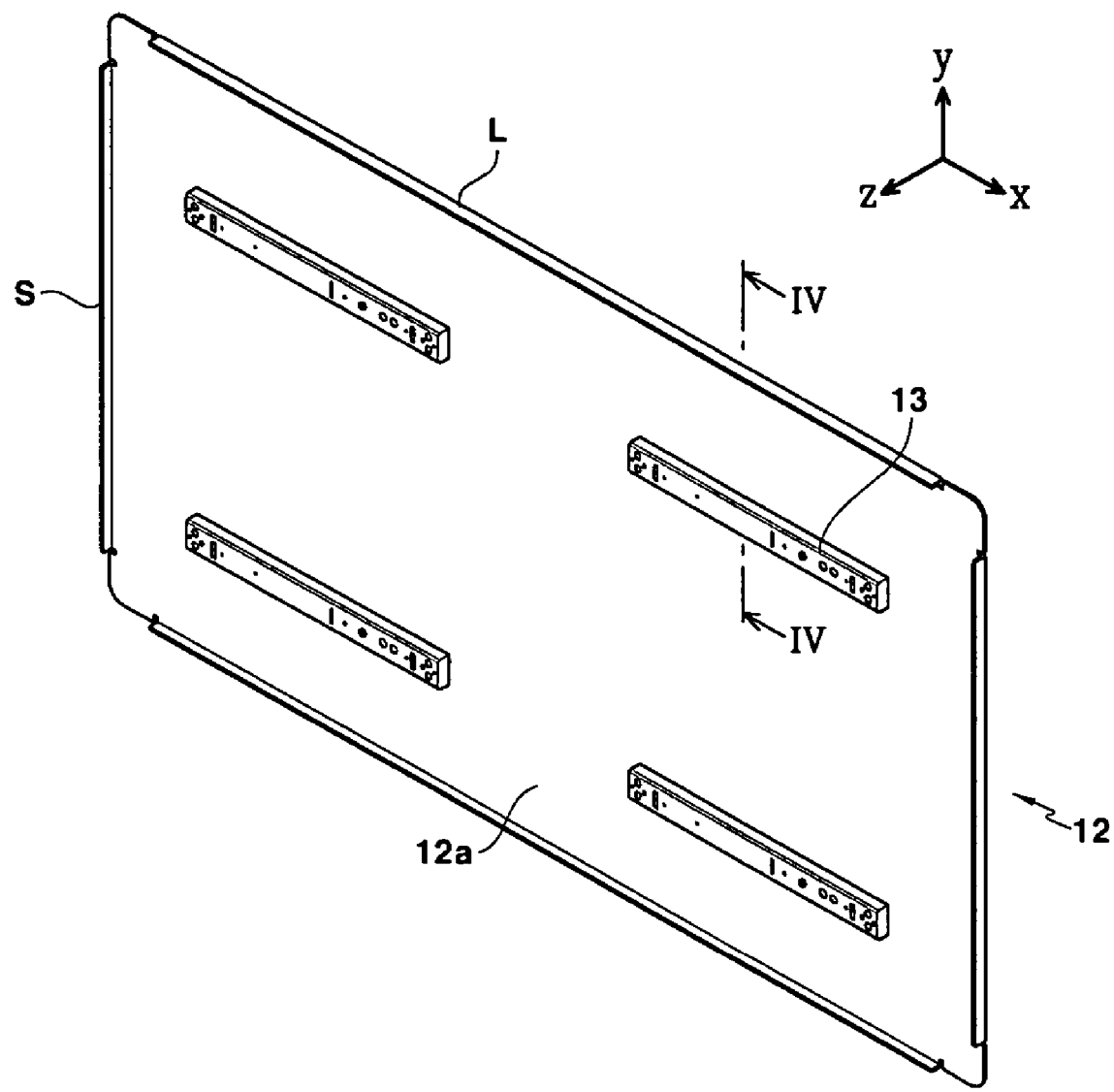
FIG. 2A is a perspective view showing a chassis base of the plasma display device according to an exemplary embodiment of the invention, as viewed from its rear surface.
Figure 2B:
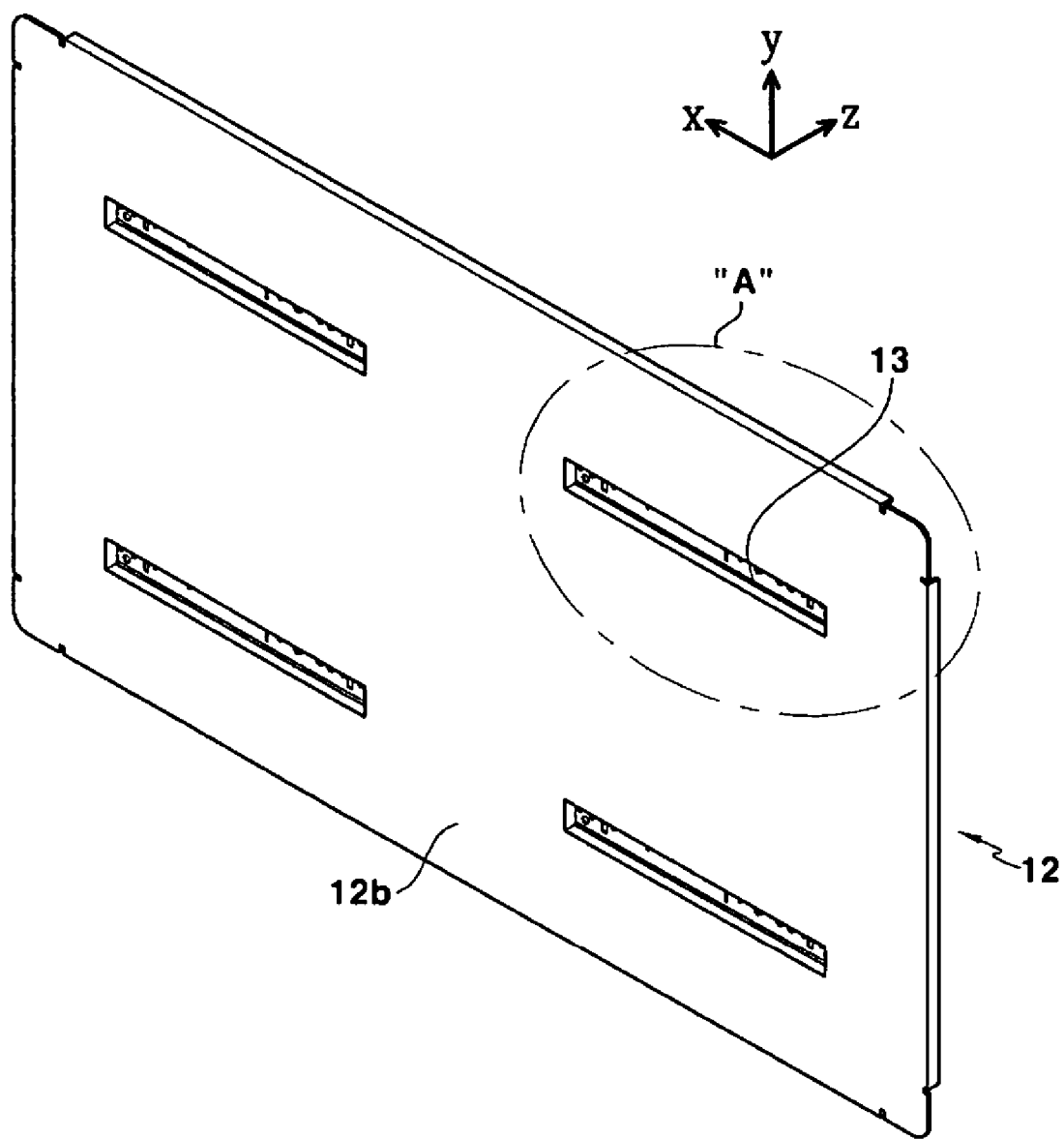
FIG. 2B is a perspective view showing the chassis base of the plasma display device according to an exemplary embodiment of the invention, as viewed from its front surface.
Figure 3:
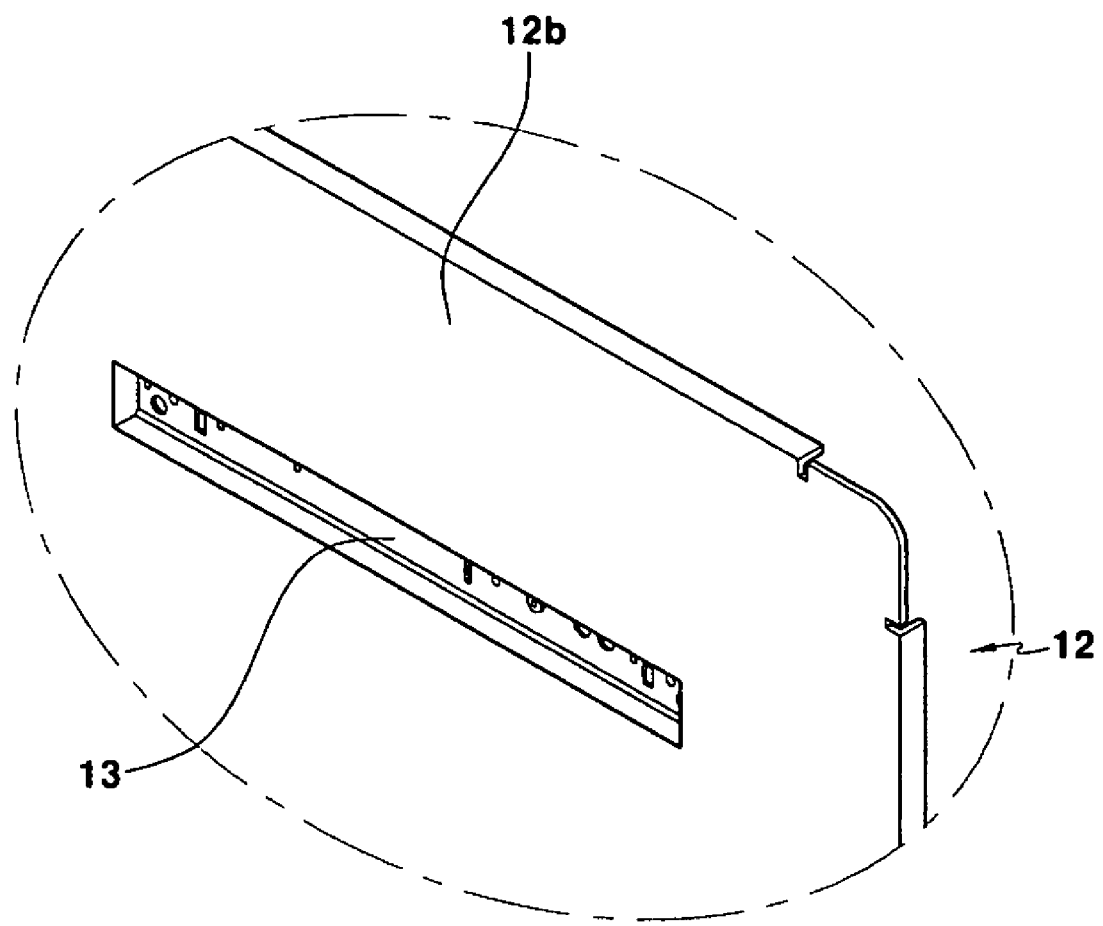
FIG. 3 is an enlarged perspective view showing a portion A of FIG. 2B.
Figure 4:
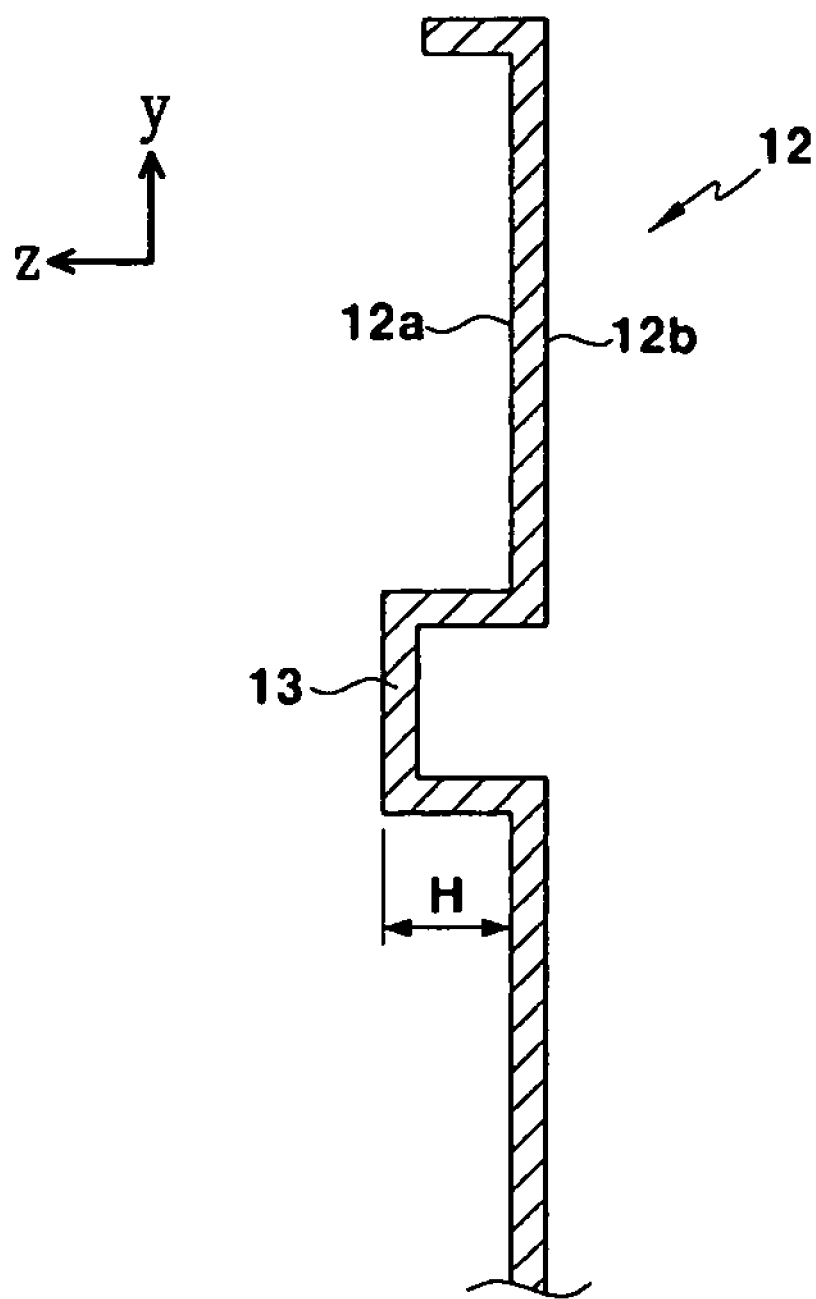
FIG. 4 is a cross-sectional view taken along line IV-IV of FIG. 2A.

FIG. 2A and FIG. 2B are perspective views showing the chassis base of the plasma display device according to an exemplary embodiment of the invention, as viewed from the base's rear and front sides, respectively. FIG. 3 is an enlarged perspective view showing a portion A of FIG. 2B, and FIG. 4 is a cross-sectional view taken along line IV-IV of FIG. 2A Referring to FIG. 1, FIG. 2A, FIG. 2B, FIG. 3 and FIG. 4, the reinforcing bracket members 13 may be integrally formed with the chassis base 12 so as to project from the circuit mounting surface 12a of the chassis base 12 facing the back cover 16 at a predetermined height H (see FIG. 4). For example, the reinforcing bracket members 13 may be integrally formed with the chassis base 12 by drawing the chassis base 12. Therefore, the reinforcing bracket members 13 project toward the opposite side of a panel mounting surface 12b of the chassis base 12 and are recessed in the panel mounting surface 12b of the chassis base 12.

When the chassis base 12 is formed in a substantially rectangular shape having a pair of long sides L and a pair of short sides S, with the two long or two short sides facing each other, the reinforcing bracket members 13 may be elongated in the long side direction (the x-axis direction of FIG. 2A) of the chassis base 12, as shown in FIG. 2A and FIG. 2B. This is because the mechanical strength of the chassis base 12 in the long side direction may be weaker than that in the short side direction.

Figure 5:
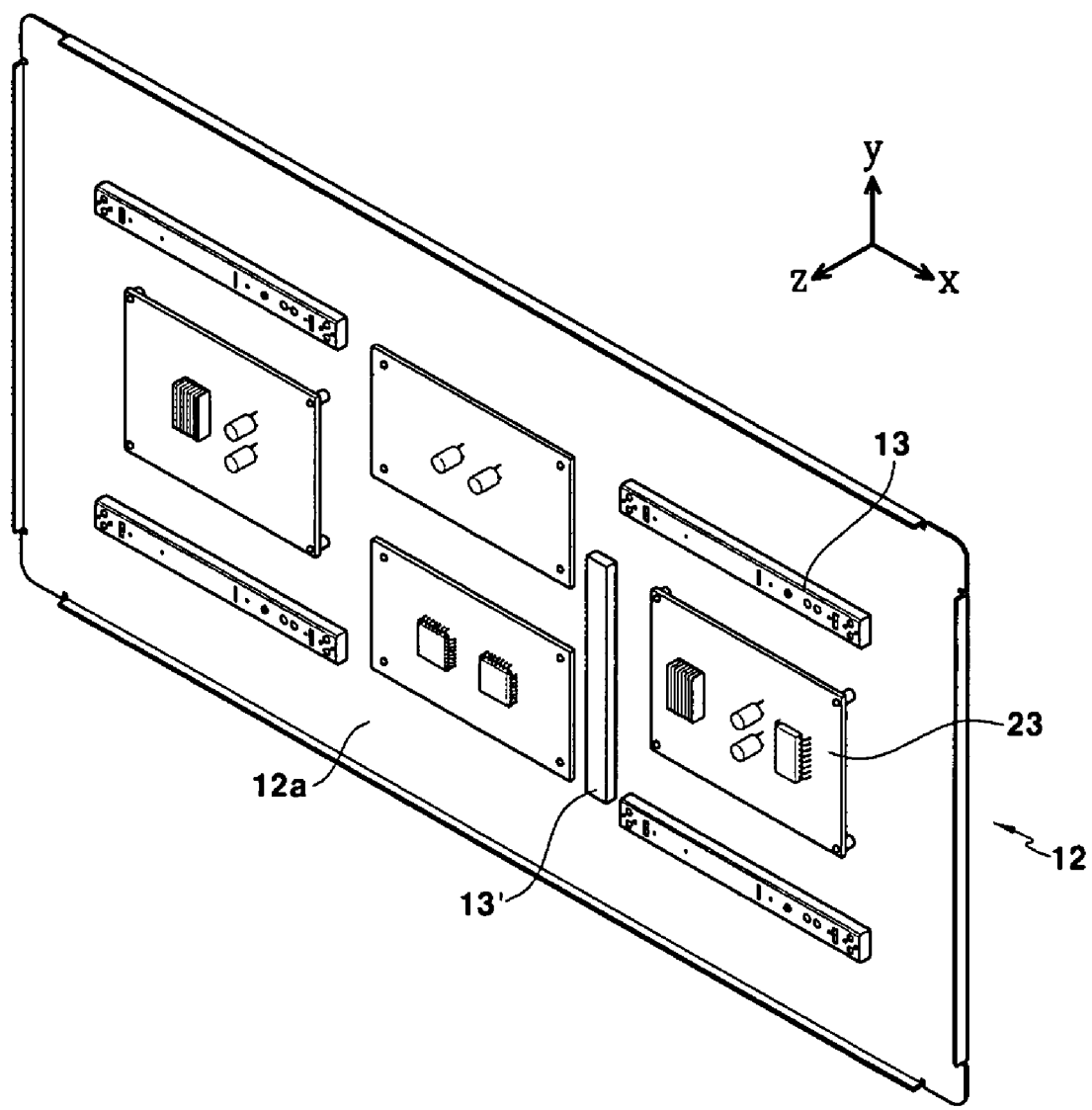
FIG. 5 is a perspective view showing circuit board assemblies mounted on the chassis base of the plasma display device according to an exemplary embodiment of the invention.
Figure 6:
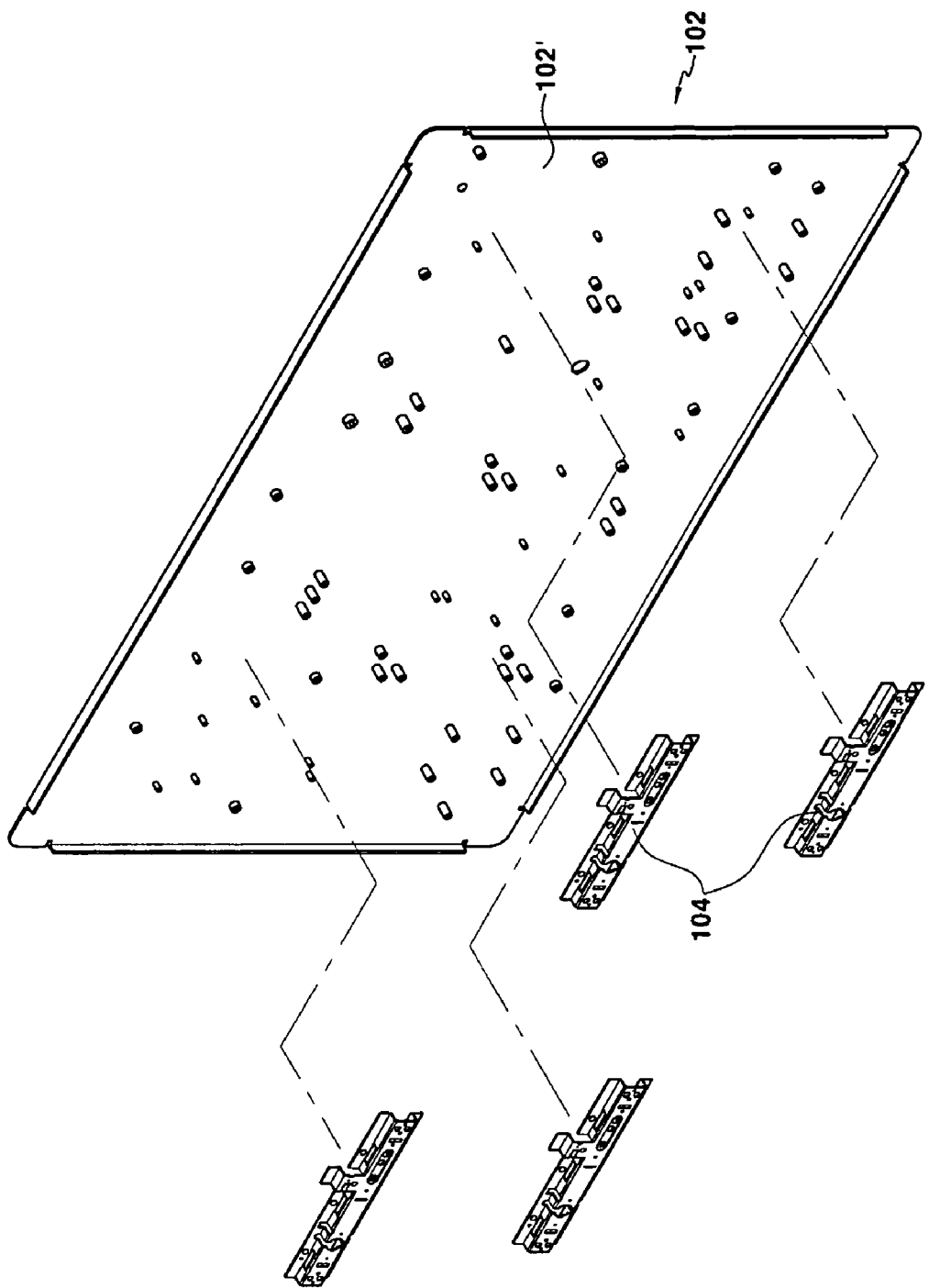
FIG. 6 is a perspective view showing un-mounted brackets and a chassis base of a conventional plasma display device.
Figure 7:
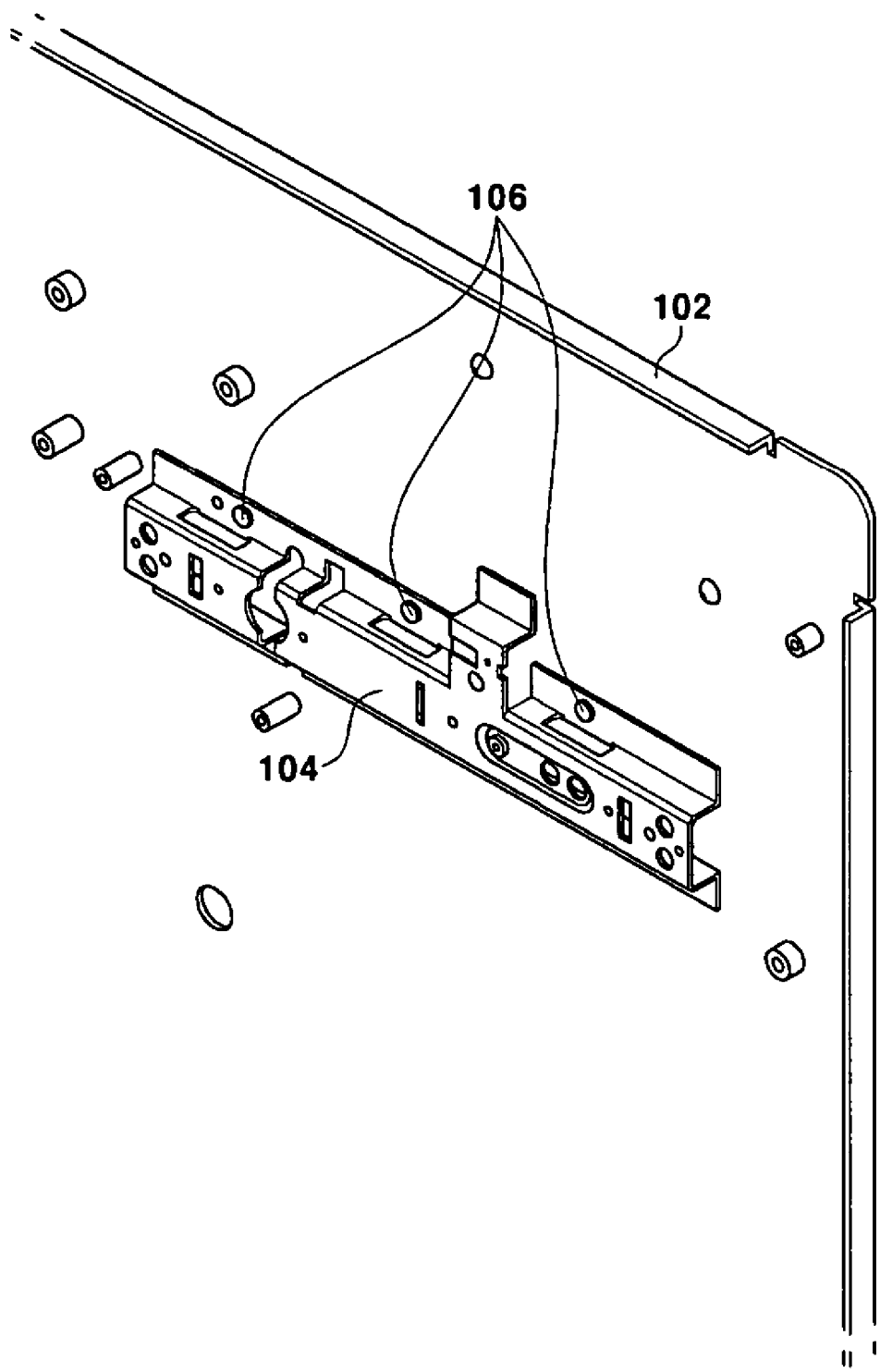
FIG. 7 is an enlarged perspective view showing a bracket mounted on the chassis base of the plasma display device of FIG. 6.

As shown in FIG. 5, the chassis base 12 may have one or more brackets provided in the short side direction.

Furthermore, the front cabinet 14 may have a conductive film filter 14a for preventing the generation of static electricity, and the conductive film filter 14a may contact the front substrate 10a of the PDP 10. Additionally, the back cover 16 may have a plurality of air holes 16a for discharging heat generated by the PDP 10 to the outside of the plasma display device.

Moreover, the plasma display device may have a thermal conductive medium 18 between the PDP 10 and the chassis base 12 to dissipate heat from the PDP 10 to the outside.

Further, an adhesive 20, such as, for example, double-sided tape, may be provided around edges of a back surface of the rear substrate 10b of the PDP 10 so as to surround the thermal conductive medium 18. Hence, the PDP 10 may be coupled with the chassis base 12 by the adhesive 20.

In FIG. 1, the thermal conductive medium 18 and the adhesive 20 are mounted on the back surface of the rear substrate 10b of the PDP 10. However, the thermal conductive medium 18 and the adhesive 20 may alternatively be mounted on a surface of the chassis base 12 facing the PDP 10.

In addition to coupling the PDP 10 with the chassis base 12, the adhesive 20 may buffer external impacts to the device and maintain a gap between the PDP 10 and the chassis base 12.

In this case, the adhesive 20 can be provided such that a space between the PDP 10 and the chassis base 12 is not airtight, so that air may circulate in the space. This structure may improve the effect of radiation due to convection occurring between the PDP 10 and the chassis base 12.

FIG. 5 is a perspective view showing circuit board assemblies mounted on the chassis base of the plasma display device according to an exemplary embodiment of the invention.

As FIG. 5 shows, the circuit board assemblies 23 may be mounted on the opposite side of the panel mounting surface of the chassis base, that is, on the circuit mounting surface 12a. In this case, the reinforcing bracket members 13 may be provided at regions of the chassis base 12 not overlapping the circuit board assemblies 23.

Further, when two or more circuit board assemblies 23 are mounted on the chassis base 12, a reinforcing bracket member 13' may be provided between adjacent circuit board assemblies 23. In this case, the bracket member 13' may be formed parallel to the short side direction of the chassis base 12.

As described above, in a plasma display device according to an exemplary embodiment of the invention, brackets are integrally formed with the chassis base to reinforce the chassis base. Thus, it is possible to solve problems arising with separate brackets, such as increased manufacturing costs and lowered productivity caused by an increased number of processes, and to reinforce the mechanical strength of the chassis base.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display device, comprising:
   a chassis base;
   a plasma display panel coupled with a panel mounting surface of the chassis base; and
   reinforcing members that are integrally formed with the chassis base and projecting from a surface of the chassis base,
   wherein each reinforcing member comprises a first side and a second side that each protrude from the chassis base, the second side being separated from the first side by an air gap, and a third side contacting the first side and the second side.

2. The plasma display device of claim 1, wherein the reinforcing members are composed of bracket members formed by drawing the chassis base.

3. The plasma display device of claim 1, wherein the reinforcing members project toward an opposite side of the panel mounting surface of the chassis base.

4. The plasma display device of claim 1, wherein at least two sides of each reinforcing member project from a circuit mounting surface at a predetermined height 5. The plasma display device of claim 1, wherein the chassis base is formed in a substantially rectangular shape having a pair of long sides and a pair of short sides, the reinforcing members being elongated substantially parallel with a long side direction of the chassis base.

6. The plasma display device of claim 1, further comprising:
   circuit board assemblies that are mounted on an opposite side of the panel mounting surface of the chassis base,
   wherein the reinforcing members are formed in regions of the chassis base not overlapping the circuit board assemblies.

7. The plasma display device of claim 1, further comprising:
   two or more circuit board assemblies that are mounted on an opposite side of the panel mounting surface of the chassis base,
   wherein the reinforcing members are formed between adjacent circuit board assemblies 8. The plasma display device of claim 1, wherein the reinforcing members are disposed within edges of the chassis base.

9. A plasma display device, comprising:
a chassis base;
a plasma display panel coupled with a panel mounting surface of the chassis base; and
reinforcing members that are integrally formed with the chassis base and projecting from a surface of the chassis base,
wherein the reinforcing members project toward an opposite side of the panel mounting surface of the chassis base, and the reinforcing members are recessed in the panel mounting surface of the chassis base.

* * * * *